MULTIRANGE OSCILLATOR CIRCUITS

Filed Aug. 1, 1945 2 Sheets-Sheet 1

INVENTOR.
BENJAMIN S. VILKOMERSON
BY
H. S. Grover
ATTORNEY

Oct. 10, 1950 B. S. VILKOMERSON 2,525,053

MULTIRANGE OSCILLATOR CIRCUITS

Filed Aug. 1, 1945 2 Sheets-Sheet 2

INVENTOR.
BENJAMIN S. VILKOMERSON
BY H. S. Grover
ATTORNEY

Patented Oct. 10, 1950 2,525,053

UNITED STATES PATENT OFFICE 2,525,053

MULTIRANGE OSCILLATOR CIRCUITS

Benjamin S. Vilkomerson, Camden, N. J., assignor to Radio Corporation of America, a corporation of Delaware Application August 1, 1945, Serial No. 608,249

7 Claims. (Cl. 250—36)

Figure 1:
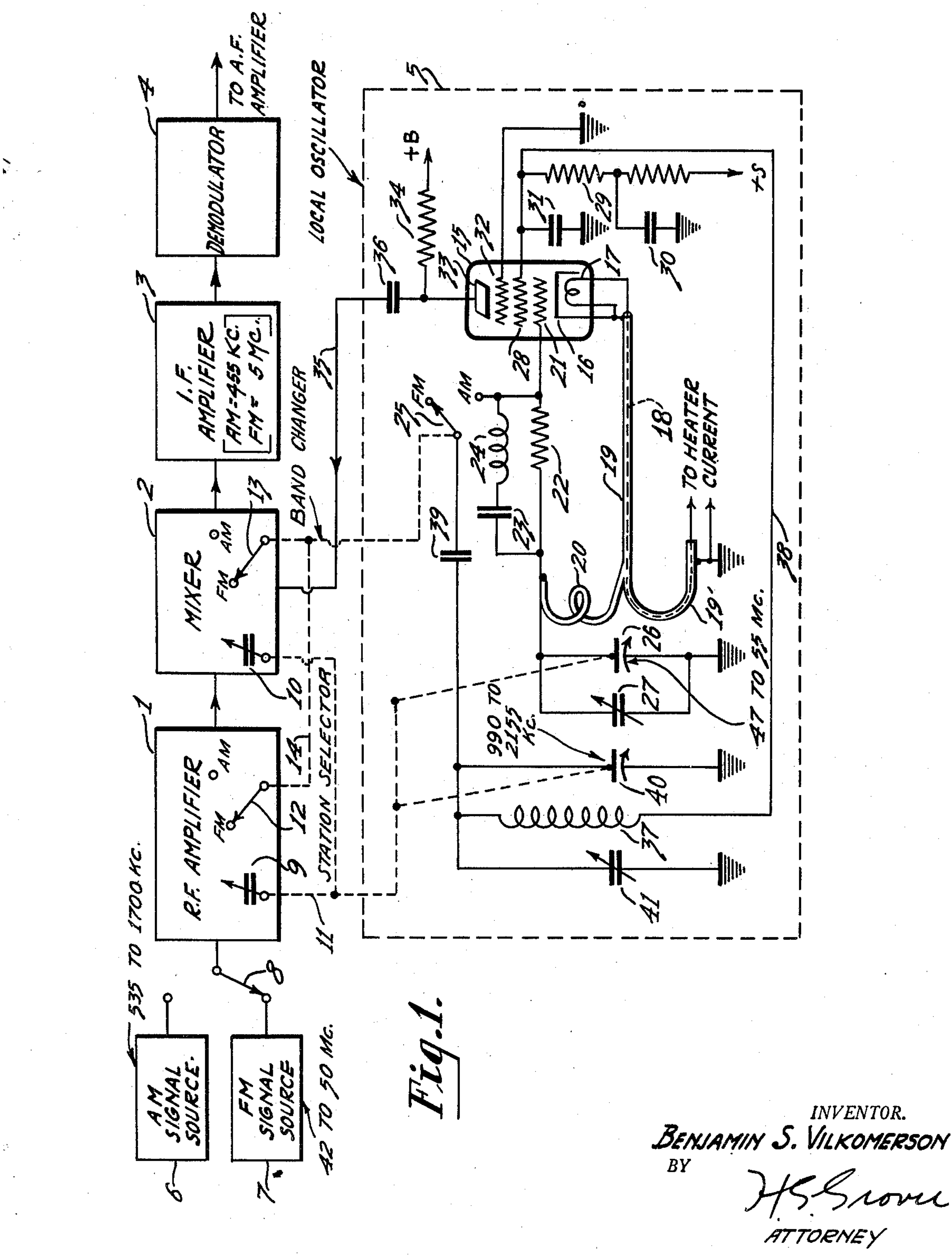

My present invention relates generally to multi-range oscillator systems, and more particularly to an improved local oscillator circuit adapted for operation in a radio signalling system employed in a plurality of signal frequency ranges.

Radio receivers of the superheterodyne type which operate over a plurality of different signal frequency bands commonly utilize a single local oscillator circuit. The oscillator circuit is generally provided with station selecting devices and wave band changing devices which are coordinated in a predetermined manner with like devices of the signal selectors of the receiver system. Special problems are encountered in multiband receivers of the superheterodyne type, particularly in the local oscillator circuit, where the frequency bands or ranges in which signals are to be received are relatively widely spaced. For example, receivers of the frequency modulation (FM) and amplitude modulation (AM) type require the local oscillator circuit to be operated over a relatively low frequency AM band and a relatively higher frequency FM band.

At the present time, in such FM-AM receivers of the superheterodyne type, the AM bands cover frequency ranges of 535 to 1700 kilocycles (kc.) and 9 to 16 megacycles (mc.), while the FM band covers a much higher frequency range of 42 to 50 megacycles (mc.). It appears that the FM band is to be shifted to a still higher frequency range, above 80 mc., e. g., 92 to 106 mc. It will be required to operate the receiver over three or more widely spaced frequency ranges. It is well known that in such multi-range receivers the local oscillator circuit should be capable of adjustment through the various oscillator frequency ranges, while at the same time functioning in a dependable and stable fashion over each oscillator frequency range.

The problem arises as to how to build an AM-FM receiver with adequate local oscillator frequency stability on the FM band. There is, also, the economic problem of evolving a circuit which would use conventional components, rather than expensive special high frequency components such as acorn tubes, ceramic switches, etc. Using conventional tubes and components, the ordinary oscillator circuit in which oscillator grid and cathode or grid and plate are switched from one coil and tuning condenser to another is disadvantageous for several reasons. First, the length of leads from tube elements to switches and then from switches to tank circuits would be almost all, or more than all, of the inductance that can be used at these high frequencies of 92 to 106 mc. The dielectric losses in switches using other than ceramic insulation would be serious, and variations in the distributed capacity would be injurious to frequency stability. Differences in inductance of the current paths through switch contacts not always closing to exactly the same positions with ordinary indexing means, again, would cause serious changes in oscillator frequency. Taking all these things into consideration, it could be decided to use a separate tube functioning only as the FM oscillator tube, and switching only its heater current on and off in changing to and from the FM band. A second tube could be used as the oscillator tube with conventional switching in the lower frequency bands.

My concept, however, dispenses with the need for separate oscillator tubes. According to my invention there is provided an oscillator circuit, which has no undesirable auxiliary circuit connected to its critical elements in the FM position, to which other apparatus is connected for lower frequency operation, and all the advantages of a separate FM oscillator tube are secured without the added expense, space requirements, and complication of two oscillator tubes.

It is, therefore, one of the important objects of my present invention to provide a multi-band receiver of the superheterodyne type, wherein there is employed a local oscillator circuit which is constructed so as to provide substantially the stability of a separate oscillator on the high frequency band of the receiver, but which, also, functions in a dependable and stable manner in one or more lower frequency bands of the system.

It is another important object of my present invention to provide a local oscillator system in a multi-range radio receiver of the superheterodyne type, as for example an FM-AM receiver, wherein the local oscillator circuit is capable of stable operation over widely different oscillation frequency ranges with minimum auxiliary circuit components.

Another object of my invention is to provide a multi-range oscillator system using an electron-coupled Hartley circuit over a relatively high oscillation frequency range, while utilizing an electron-coupled Colpitts circuit over one or more relatively lower oscillation frequency ranges.

A more specific object of my present invention is to provide in a multi-band superheterodyne receiver, a local oscillator circuit which employs, unlike in prior practice, a cathode-circuit feedback for operation over a higher frequency signal band, while employing a capacity feedback arrangement for a lower frequency signal band.

Still further, and more specific, objects of my invention are to improve the simplicity, efficiency and stability of the local oscillator circuit for FM-AM receivers of the superheterodyne type, and more especially to provide a multi-range local oscillator circuit in an economical and easily assembled manner.

In accordance with my invention I provide a multi-range oscillator, in which the frequency stability requirements of the highest frequency band are particularly critical, wherein in the highest frequency band position none of the frequency determining elements are connected to the oscillator tube electrodes by way of mechanically-operated switches, and none of the current paths go through switch connections. Current paths through switch connections are included only in the lower frequency range circuits, and function only when the system is operated over the lower frequency ranges thereby enhancing the frequency stability of the oscillator on the highest frequency band.

Still other features of my invention will best be understood by reference to the following description, taken in connection with the drawings, in which I have indicated diagrammatically two circuit organizations whereby my invention may be carried into effect.

Figure 2:
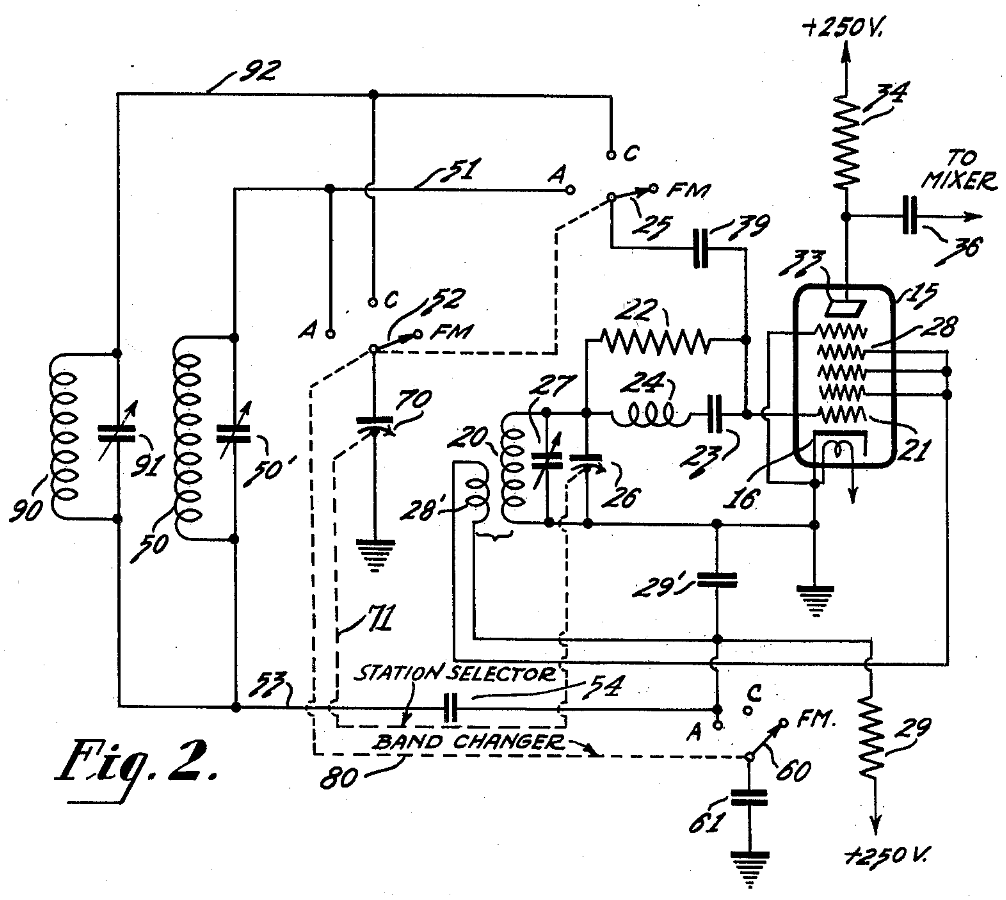

In the drawings:

Fig. 1 shows, partly schematically, a multi-band FM-AM receiver embodying the invention; and Fig. 2 shows the circuit diagram of a modification of the local oscillator system.

Referring now to the accompanying drawings, wherein like reference characters in the different figures designate similar circuit elements, I have shown in Fig. 1 an FM-AM superheterodyne receiver which generally comprises a selective radio frequency amplifier 1, a mixer 2, an intermediate frequency (I. F.) amplifier 3 and a demodulator 4. The local oscillator system is shown in detail in the dash line rectangle 5. The networks 1, 2, 3 and 4 are schematically represented, since those skilled in the art of radio communication are aware of suitable circuits which may be used for these networks. The receiving system, assumed to be used for AM or FM signal reception, may be selectively connected to an AM signal source 6 or to an FM signal source 7 by means of a changeover switch 8. Sources 6 and 7 are schematically respresented, and may be respective grounded antenna and dipole circuits. The AM signal source 6 may provide amplitude modulated carrier signals to amplifier 1 in a range of 535 to 1700 kc., the present AM broadcast band. An additional AM band could be provided, say 9 to 16 mc., and would be only a duplication of the lower AM band with added switch positions. The FM signal source 7 may supply FM signals in a range of 42–50 mc. or 92 to 106 mc. These frequency ranges may be in other bands, and sources 6 and 7 may be transmission lines instead of signal collection devices.

The amplifier 1, mixer 2, I. F. amplifier 3 and demodulator or detector 4 may each be constructed in any suitable manner known in multi-band superheterodyne receivers. I have schematically represented the station selector devices of networks 1 and 2 by numerals 9 and 10 respectively. It will be understood that these selector devices are concurrently variable by uni-control means, as indicated by dash lines 11. The numerals 12 and 13 denote the respective band changer devices for networks 1 and 2. Thus, when the devices 12 and 13 are adjusted concurrently (as by the schematically represented common actuating device 14) to the contacts or positions marked "FM," the networks 1 and 2 are conditioned to respond to FM signals in the 42–50 mc. or other selected band. The switch 8 would, by concurrent, uni-controlled operation if desired, be adjusted to connect FM signal source 7 to the network 1.

Upon adjustment of devices 12 and 13, as well as switch 8, to the positions or contacts "AM," the networks 1 and 2 are conditioned to receive AM signals in the 535 to 1700 kc. band. Accordingly, under present standards of AM and FM broadcasting, the station selector devices 9 and 10 will operate to tune networks 1 and 2 over a band of 535–1700 kc. or 42–50 mc. depending on the adjustment of the band changer devices 12 and 13. Any suitable mechanical construction may be employed for accomplishing these functions.

The mixer 2 has applied thereto from local oscillator 5 local oscillations whose frequency may be selected from a range of 990 to 2155 kc., or 47 to 55 mc. It has been assumed that an I. F. of 455 kc. is used for AM signal reception, while an I. F. or 5 mc. is used for FM signal reception. That is, there will be produced in the output circuit of mixer 2 signals of an I. F. of 455 kc. for AM reception, while the signals will have an I. F. of 5 mc. for FM signal reception.

Of course, the I. F. values for the AM and FM bands can be of any other desired magnitudes. The I. F. amplifier 3 and demodulator 4 are suitably constructed respectively to amplify and demodulate the I. F. signals of either 455 kc. or 5 mc. Those skilled in the art of radio communication will be fully aware of suitable circuits to employ at networks 3 and 4. For example, the FM-AM demodulator shown by W. R. Koch in Fig. 1 of his application Serial No. 521,193, filed February 5, 1944, now Patent No. 2,429,762 may be employed at network 4. The demodulated output of network 4 is applied to an audio frequency amplifier followed by a suitable reproducer (not shown). The aforegoing description of the receiver system is necessarily brief and general, since it forms no part of my present invention. It is included to indicate the utility of the novel local oscillator 5, whose circuit details will now be described.

The oscillator tube 15 is of the pentode type, although the invention is not restricted to a tube of this type. The cathode 16 is indirectly heated by heater element 17. The opposite ends of the heater element 17 are connected to a source of heater current (not shown). One end of the heater element 17 is connected to the cathode 16 and to metallic shielding tubing 19, while the other terminal of heater element 17 is connected to the high potential terminal of the heater current source through a lead 18 which is run through the tubing 19. Section 19' of tubing 19 forms the lower section of the tank coil 20 and is grounded at the end not connected to cathode 16. The high potential end of coil 20 is connected to the control grid 21 through resistor 22. Resistor 22 is shunted by condenser 23 arranged in series with coil 24. The grid end of coil 24 has a contact designated "AM." A companion contact, designated "FM," provides the second of a pair of contacts for switch arm 25.

The tank coil 20, consisting of a metal tube of suitable inductive magnitude, is shunted by the variable tuning condenser 26 and the trimmer condenser 27. The rotor or adjustable element of condenser 26 is mechanically coupled in any suitable manner to the station selector device 11. Dash lines schematically indicate such mechanical coupling. The screen grid 28 of pentode tube 15 is connected to a suitable source of positive voltage +S through voltage-reducing resistor 29, whose intermediate point is bypassed to ground by condenser 30 and whose upper end is bypassed to ground by condenser 31. The suppressor grid 32 is preferably connected directly to ground, and the plate 33 is connected to a source of suitable positive voltage +B through load resistor 34.

The plate 33 is at a higher positive voltage than screen 28. The plate 33 is connected through path 35, which includes coupling condenser 36, to the mixer network 2. Those skilled in the art of radio communication are fully aware of the manner of applying the oscillatory voltage developed across load resistor 34 to a suitable electrode of the mixer network 2. Such specific circuit connection is no part of the present invention, and, therefore, path 35 schematically represents a path for injecting local oscillations into the mixer circuit.

The tank circuit 26, 20 is utilized when the switch arm 25 is placed, as in Fig. 1, at the FM position. However, when the switch arm 25 is shifted into connection with the AM contact, there is connected into operative association with the oscillator tube 15 a second tank circuit. Concurrently, the tank circuit 20, 26 is effectively short-circuited or eliminated from electrical association with the oscillator tube, because the capacitance of condenser 39 is of about ten times the value of the capacitance of condenser 23. Condenser 39 with its associated low frequency tank circuit, being on the grid side of the high frequency tank circuit coupling condenser 23, reduces the magnitude of high frequency voltages coming from the high frequency tank circuit to the oscillator grid to values far below those required to maintain high frequency oscillations. On the other hand, in the AM position the small capacitance of condenser 23 in association with its circuit hardly reduces the coupling of the low frequency tank circuit voltages to the oscillator grid circuit by more than a few percent, thereby causing its tube to stop oscillating at high frequency and start oscillating at its frequency determined by the low frequency tank circuit.

The second tank circuit comprises the coil 37 whose lower end is connected by lead 38 to the upper end of condenser 31 and resistor 29. The upper high potential end of coil 37 is connected to the high potential side of tuning condenser 40 and by condenser 39 to the switch arm 25. In other words when switch arm 25 is connected to the grid 21, there exists feedback from the screen grid 28 through coil 37 and condenser 39 to control grid 21. The coil 37 is effectively shunted by two condensers in series, 40 and 31, with the connection common to the two condensers grounded. As shown, the rotor of condenser 40 is grounded. The numeral 41 denotes a trimmer condenser which is shunted across tuning condenser 40.

The rotor of tuning condenser 40 is preferably mechanically coupled with station selector 11, and the dash lines indicate the common mechanical coupling of the rotors of station selectors 9 and 10 and the tank circuit tuning condensers 40 and 26. Any suitable common actuating device may be utilized concurrently to vary the frequency adjustment devices 9, 10, 26 and 40.

Furthermore, any suitable mechanical device may be utilized to actuate the wave-band changers 12, 13, and 25. The dash lines 14 indicate a suitable means for concurrently adjusting switches 12, 13, and 25 selectively to condition the receiver for FM or AM signal reception. I have indicated the tank circuit 20, 26 as being adjustable in frequency over a range of 47 to 55 mc., while the tank circuit 37, 40 is adjustable over a frequency range of 990 to 2155 kc. These respective oscillation frequency ranges cooperate with the respective AM and FM signal frequency ranges to provide the desired I. F. signal of either 455 kc. or 5 mc. It will be noted that the local oscillator, whether adjusted for AM or FM reception, provides the desired oscillation frequency which is generally higher than the selected signal frequency.

Condensers 27 and 41 are trimmers, and determine the high frequency ends of the tuning ranges of the oscillator in their respective bands. The setting of the trimming condenser determines the minimum value of capacity to which the variable tuning condenser can adjust the total minimum capacity of the respective tank circuit, and hence the highest frequency to which it can be made to resonate.

Regardless of whether the switch 25 is adjusted to its FM or AM position, tube 15 functions as an electron-coupled oscillator. The pentode tube is connected so that its first two inner grids 21 and 28 constitute the control grid and plate respectively for a triode oscillator, while the circuit connected to plate 33 supplies the load. The electron stream flowing from cathode 16 to plate 33 is varied by the oscillating potential on the control grid 21, so that the plate current flowing through load resistor 34 is modulated at the oscillator frequency.

The third grid 32, which may be maintained either at cathode potential or at ground potential, acts as an electrostatic screen which shields the plate 33 from the inner grids 21 and 28. In this way there is eliminated any capacitance between plate 33 and the two inner grids of the tube. Consequently, variations in the load will have a negligible effect on the frequency of the oscillations, since the electron stream that supplies output is unidirectional, and the internal tube capacitances (capacitive feedback paths) between the plate and the first two grids have been reduced to very minute values. It is to be understood that no external capacitances, or other sources of coupling, between the load and the oscillatory circuits should be allowed to exist if maximum frequency stability is to be secured. The electron-coupled oscillator possesses a highly satisfactory frequency-load stability.

Whereas in multi-band receivers of the prior art, it has been usual to employ cathode circuit feedback on the AM broadcast band, and a conventional plate circuit tickler for the medium and short wave bands, in my present circuit the short wave or high frequency band employs a Hartley type of connection. As the screen grid 28 has positive potential applied to it through the resistor 29, the screen grid serves as the plate of the triode oscillator comprising the tank circuit 20, 26, control grid 21, cathode 16 and the screen grid 28. The portion 19' of tank coil 20 between cathode 16 and ground acts as the tickler or feedback coil, because it is in series with the cathode circuit. The screen grid 28 is maintained at a positive potential sufficiently above that of the cathode so that enough of the electrons emitted by the cathode strike the screen grid to cause strong sustained oscillations to be generated in the control grid tank circuit.

The frequency of the oscillations is determined mainly by the value of coil 20 and condenser 26 in the tank circuit. However, the larger number of electrons is attracted by the higher positive potential on plate 33, whereby they pass through the openings in the mesh of the screen grid and reach the plate thereby causing current to flow through load resistor 34. Since the intensity of the stream of electrons passing through screen 28 and grid 32 is being varied by the oscillating potential at control grid 21, the plate current of the tube is modulated at the oscillator frequency. The condensers 31 and 30 are of such capacitance as to maintain the screen 28 at effectively ground radio frequency potential for FM band frequencies; therefore the grid 28, also, functions as a screen grid between plate 33 and control grid 21. By maintaining the ratio of the screen to plate direct current plate potentials at a suitable value, excellent frequency stability is assured.

When the switch arm 25 is shifted to the AM contact, the oscillator tube is connected in a Colpitts type of oscillator circuit. In this case the oscillator anode 28 feeds back radio frequency voltage to control grid 21 through the coil 37 and condenser 39 in series. The tank circuit 20, 26 is rendered ineffective at the frequency range of tank circuit 37, 40. It will be seen that the FM oscillator circuit resolves itself into nothing more than a grid leak resistor 22 shunted by a small condenser 23, and both in parallel with the low frequency trimmer condenser 41. To avoid restricting the range of trimmer condenser 41, the condenser 23 should be made as small as possible. The capacity of condenser 23 may be made very small (say 5 to 10 micromicrofarads) without adversely affecting the FM oscillator function, by bucking its reactance with a small series inductor 24. At the same time the effective capacity in parallel with trimmer condenser 41 is, at low frequency, the actual capacitance of grid condenser 23. This arrangement of a reduced value of grid coupling condenser with a bucking inductive reactor is generally applicable where a minimum time constant is desirable.

When functioning as a low frequency oscillator, in the Colpitts connection, the increase of output voltage with decreasing frequency can be controlled by varying the value of the feedback condenser 39, or of resistor 29 which is effectively in shunt with condenser 31, and which, therefore, acts to reduce the rise in output voltage at the low frequency end of the AM oscillator range. When the oscillator system is functioning at the high frequency range, as a Hartley oscillator, stability is improved by keeping the heater at the same radio frequency potential as the cathode. This has been accomplished by connecting the grounded side of heater 17 to the cathode 16, causing the section 19' of tank coil 20 to be constructed of thin copper tubing, and running the heater wire 18 through the tube 19 as indicated in Fig. 1. This eliminates the use of a radio frequency choke in the heater lead, and is more effective over the whole band of frequencies. This method may be applied to grounded grid amplifier circuits, where the cathode is kept at a high radio frequency potential and the heater to cathode capacitance is troublesome.

In Fig. 2 I have shown a modification of the local oscillator system of Fig. 1, wherein the oscillator is shown adapted for operation in three frequency bands or ranges. Furthermore, in this modification the Hartley connection is replaced by a tickler feedback connection with grounded cathode for FM operation. This modification is simpler and cheaper to construct, but will not in general provide as good frequency stability or as uniform output over the tuning range as the Hartley circuit arrangement shown in Fig. 1. It is, also, to be noted that the oscillator tube is specifically of the pentagrid type, as for example a 6SA7 or 5642 type of tube. However, the tube functions as described in connection with Fig. 1. The indirectly heated cathode 16 thereof is grounded. Control grid 21 is connected to the high potential side of the tank circuit 20, 26 through the condenser 23 and coil 24 in series, the latter two elements being shunted by the grid leak resistor 22. The three intermediate grids are tied together, and, therefore, function as the positive oscillator anode 28. The electrode 28 is connected through tickler coil 20', which is coupled magnetically to tank coil 20, to a source of positive voltage as indicated, through the resistor 29 the upper end of which is bypassed to ground by condenser 29'.

The plate 33 is coupled to the mixer tube through condenser 36, and is connected to the positive potential source through the load resistor 34. The wave-band changer switch 25 cooperates with three contacts indicated as "FM," "C," and "A." These represent respectively the high frequency range, the medium frequency range and the low frequency range. For example, the A range may be the standard AM broadcast range of 535 to 1700 kc., while the C range may correspond to a frequency range (9 to 16 mc.) intermediate the frequency ranges indicated in Fig. 1 for the oscillator system. Switch 25 is coupled to grid 21 through condenser 39. In this way when the switch arm 25 is shifted into connection with either of contacts C or A, there is provided due to voltage drop across resistor 29 capacity feedback from the anode element 28 through the corresponding auxiliary tank circuit and condenser 39 to grid 21. It will, therefore, be seen that operation on the lower frequency bands is by means of the Colpitts connection, as shown in Fig. 1.

The tank circuit for the A range consists of coil 50 whose upper end is connected to contact A of switch 25 through lead 51. Lead 51 is connected to a second contact A of switch arm 52. The lower end of coil 50 is connected to a lead 53 and condenser 54 to the contact A of a switch arm 60. The contact A of switch arm 60 is connected to the junction of coil 20' and condenser 29'. The switch arm 52 is connected to ground through the variable tuning condenser 70. The common adjusting means 71, shown in dash lines, functions as the station selector device by virtue of the fact that it adjusts the rotors of variable condensers 70 and 26 concurrently. Coil 50 is shunted by the trimmer condenser 50'. The switch arm 60 is connected to ground through condenser 61, and the switch arms 25, 52 and 60 are represented as being mechanically coupled by a common wave-band changer device 80, schematically indicated by the dash lines.

The tank circuit for the C band consists of the coil 90, shunted by trimmer condenser 91, having its upper end coupled by lead 92 to the C contact of each of switch arms 25 and 52, The lower end of coil 90 is connected to lead 53, and switch arm 60, is also, provided with a C contact. It will now be seen that when the oscillator circuit of Fig. 2 operates in the FM band, as shown in Fig. 2, the switches 52, 25 and 60 are all adjusted to their respective FM contacts. In this case adjustment of station selector device 71 varies the frequency of the tank circuit 26, 20. However, when the switches 25, 52 and 60 are shifted to the respective C contacts, switch arm 25 causes tank circuit 90, 70 to be capacity coupled through condenser 39 to the grid 21. Of course, in that case the tank circuit 20, 26 is rendered ineffective, as explained in connection with Fig. 1.

It will be noted that condenser 61 is still not connected in circuit with the oscillator system. Upon adjustment of the switches 25, 52 and 60 to their respective A contacts, the result is to cause tank circuit 50, 70 to be electrically connected through condenser 39 to the oscillator grid 21. At the same time condenser 61 is connected in circuit to provide an added capacitance in parallel with condenser 29′, thereby to pad the A band. It is pointed out that condenser 29′ functions as a bypass condenser for the frequencies of tank circuit 20, 26, and, also, functions as a padder and range limiting condenser on the C band. In both the C and A bands condensers 70, 29′ and 54 are connected in series across each of the coils 50 or 90 respectively.

While I have indicated and described several systems for carrying my invention into effect, it will be apparent to one skilled in the art that my invention is by no means limited to the particular organizations shown and described but that many modifications may be made without departing from the scope of my invention.

What I claim is:

1. In an oscillator system adapted to operate over relatively widely spaced frequency ranges, a tube including at least a cathode, a control grid, an oscillator anode electrode and an output electrode, means for establishing said anode and output electrodes at positive potentials, a first tank circuit including means for tuning it to a relatively high frequency, said first tank circuit being permanently coupled to said cathode, control grid and anode in the manner of a Hartley circuit, a second tank circuit including means for tuning it to a relatively low oscillation frequency, means for coupling said second tank circuit to said cathode, control grid and anode in the manner of a Colpitts circuit, and said last means concurrently rendering said first tank circuit electrically ineffective.

2. In combination with a cathode, control grid and a positive cold electrode of an oscillator tube of the electron-coupled type, a first tank circuit permanently connected to the cathode, control grid and cold electrode to provide an oscillator system, said first tank circuit including a coil and means for tuning it over a very high frequency range, a second tank circuit, switch means for concurrently rendering the first tank circuit electrically ineffective in the oscillator system and connecting the second tank circuit into the oscillator system, said second tank circuit including means for tuning it over a relatively low frequency range, said cathode being connected to an intermediate tap on the coil of the first tank circuit, and said switch means connecting the second tank circuit to the control grid through a coupling condenser.

3. In combination with a cathode, control grid and a positive cold electrode of an oscillator tube of the electron-coupled type, a first tank circuit permanently connected to the cathode, control grid and cold electrode to provide an oscillator system, said first tank circuit including means for tuning it over a very high frequency range, a second tank circuit, means for concurrently rendering the first tank circuit electrically ineffective in the oscillator system and connecting the second tank circuit into the oscillator system, said second tank circuit including means for tuning it over a relatively low frequency range, a third tank circuit, and said means being constructed selectively to connect the third tank circuit into electrical connection with the oscillator system, while maintaining the first tank circuit electrically ineffective and the second tank circuit disconnected.

4. In an oscillator system adapted to operate over spaced frequency ranges, a tube including at least a cathode, a control grid, an oscillator anode and an output electrode, means for establishing said anode and output electrodes at positive potentials, a first tank circuit including means for tuning it to a relatively high frequency, said first tank circuit being permanently connected to said cathode, control grid and anode in the manner of a Hartley circuit, a second tank circuit including means for tuning it to a relatively low oscillation frequency, means for coupling said second tank circuit to said cathode, control grid and anode in the manner of a Colpitts circuit, and said last means comprising a switch concurrently rendering said first tank circuit electrically ineffective.

5. In combination with a cathode, control grid and a positive cold electrode of an oscillator tube, a first tank circuit permanently connected to the cathode, control grid and cold electrode to provide an oscillator system, said first tank circuit including a coil and means for tuning it over a high frequency range, a second tank circuit, switch means for concurrently rendering the first tank circuit electrically ineffective in the oscillator system and connecting the second tank circuit into the oscillator systems, said second tank circuit including means for tuning it over a low frequency range, said cathode being connected to an intermediate tap at the coil of the first tank circuit, and said switch means connecting the second tank circuit to the control grid through a coupling condenser.

6. In combination with a cathode, control grid and a positive cold electrode of an oscillator tube, a first tank circuit permanently connected to the cathode, control grid and cold electrode to provide an oscillator system, said first tank circuit including a coil having its high potential end connected to said grid by a small condenser whose capacitive reactance is largely balanced out by a small series inductor, means for tuning the coil over a very high frequency range, a second tank circuit, a switch for concurrently rendering the first tank circuit electrically ineffective in the oscillator system and connecting the second tank circuit into the oscillator system, said second tank circuit including means for tuning it over a relatively low frequency range, said cathode being connected to an intermediate tap on the coil of the first tank circuit, and said switch connecting the second tank circuit to the control grid through a coupling condenser.

7. In a multi-range oscillator in which the frequency stability requirements of the highest frequency band are particularly critical, a circuit arrangement for improving the frequency stability of the oscillator on the highest frequency band comprising an oscillator tube having input and output electrodes, frequency determining elements for said highest frequency band, a small condenser for permanently coupling said highest frequency band frequency determining elements to said input electrodes, a small series inductor connected to said condenser for largely balancing out the capacitive reactance at high frequencies, lower frequency band frequency determining elements, means for selectively connecting the latter elements to the same input electrodes whereby the tube oscillates in the lower frequency band, while the highest frequency band frequency determining elements have negligible electrical effect on the operation of the oscillator in the lower frequency band, and an output circuit coupled to said output electrodes.

BENJAMIN S. VILKOMERSON.

REFERENCES CITED

The following references are of record in the file of this patent:

UNITED STATES PATENTS

| Number | Name | Date |
|---|---|---|
| 2,034,974 | Cotter et al. | Mar. 24, 1936 |
| 2,168,924 | Dow | Aug. 8, 1939 |
| 2,230,557 | Babik et al. | Feb. 4, 1941 |
| 2,254,739 | Grayson | Sept. 2, 1941 |
| 2,354,959 | McCoy | Aug. 1, 1944 |
| 2,355,470 | Boot | Aug. 8, 1944 |
| 2,434,299 | Van Loon | Jan. 13, 1948 |
| 2,443,935 | Shea | June 22, 1948 |